US012805288B2

(12) United States Patent
Mignot et al.

(10) Patent No.: US 12,805,288 B2

(45) Date of Patent: Nov. 17, 2026

(54) BEOL TOP VIA WIRINGS WITH DUAL DAMASCENE VIA AND SUPER VIA REDUNDANCY

(71) Applicant: International Business Machines Corporation, Armonk, NY (US)

(72) Inventors: Yann Mignot, Slingerlands, NY (US); Chanro Park, Clifton Park, NJ (US); Jacques Simon, Delmar, NY (US); Hsueh-Chung Chen, Cohoes, NY (US); Chi-Chun Liu, Altamont, NY (US)

(73) Assignee: International Business Machines Corporation, Armonk, NY (US)

( * ) Notice: Subject to any disclaimer, the term of this patent is extended or adjusted under 35 U.S.C. 154(b) by 733 days.

(21) Appl. No.: 17/536,269

(22) Filed: Nov. 29, 2021

(65) Prior Publication Data

US 2023/0170293 A1 Jun. 1, 2023

(51) Int. Cl.

*H10W 20/42* (2026.01)
*H10W 20/00* (2026.01)

(52) U.S. Cl.

CPC ......... *H10W 20/42* (2026.01); *H10W 20/056* (2026.01); *H10W 20/062* (2026.01); *H10W 20/084* (2026.01); *H10W 20/092* (2026.01)

(58) Field of Classification Search

CPC ......... H01L 21/76807; H01L 21/76819; H01L 21/7684; H01L 21/76877; H01L 23/5226
See application file for complete search history.

(56) References Cited

U.S. PATENT DOCUMENTS 5,686,354 A 11/1997 Avanzino et al.
5,970,376 A 10/1999 Chen
(Continued)

FOREIGN PATENT DOCUMENTS

CN 101378632 A 3/2009
CN 101685812 A 3/2010
(Continued)

OTHER PUBLICATIONS

Paolillo et al., "Direct metal etch of ruthenium for advanced interconnect", JJ. Vac. Sci. Technol., B, vol. 36, No. 3, May 2, 2018, 03E103, pp. 1-10.
(Continued)

*Primary Examiner* — Tony Tran

(74) *Attorney, Agent, or Firm* — Scully, Scott, Murphy & Presser, P.C.; Samuel A. Waldbaum

(57) ABSTRACT

The present invention relates to integrated circuits and related method steps for forming an IC chip. The method steps result in semiconductor device structures that include redundant same via level formation using a top via subtractive etch and bottom via from dual damascene etch techniques. In embodiments, the same level redundancy via option is optional. Provision of redundant same via level connections using dual damascene processes improves device resistance and capacitive performance. Further method steps result in semiconductor device structures that include a direct super via connection bypassing subtractive etch metal level via formations. These highlighted method steps increase design flexibility—and reduce device footprint (by skipping a metal level) with the benefit of reduced via connection height and shorter metal connections. Such method steps and resulting IC device structures utilizes the underutilized space and allows further size reduction of the (Continued)

500

IC chips without adversely impacting the device performance.

5 Claims, 10 Drawing Sheets

(56) References Cited

U.S. PATENT DOCUMENTS

| | | | | |
|---|---|---|---|---|
| 6,867,073 | B1 | 3/2005 | Enquist | |
| 8,114,769 | B1 | 2/2012 | Srivastava et al. | |
| 9,365,946 | B2 | 6/2016 | Busnaina et al. | |
| 9,385,078 | B1 | 7/2016 | Feurprier et al. | |
| 9,589,093 | B2 | 3/2017 | Hong | |
| 9,613,861 | B2 | 4/2017 | Anderson et al. | |
| 9,646,881 | B2 | 5/2017 | Bruce et al. | |
| 9,786,597 | B2 | 10/2017 | Chang et al. | |
| 9,805,972 | B1 | 10/2017 | Zhang et al. | |
| 10,020,254 | B1 | 7/2018 | Bao et al. | |
| 10,020,255 | B1 * | 7/2018 | Bao | H10W 20/42 |
| 10,199,264 | B2 | 2/2019 | Zhang et al. | |
| 2003/0096436 | A1 * | 5/2003 | Satya | G01R 31/307 438/11 |
| 2007/0134917 | A1 | 6/2007 | Li et al. | |
| 2008/0020488 | A1 | 1/2008 | Clevenger et al. | |
| 2008/0124484 | A1 | 5/2008 | Shinriki et al. | |
| 2010/0072629 | A1 | 3/2010 | Lee | |
| 2013/0127584 | A1 | 5/2013 | Filippi et al. | |
| 2015/0056800 | A1 | 2/2015 | Mebarki et al. | |
| 2015/0235946 | A1 * | 8/2015 | Bonilla | H01L 23/53295 257/758 |
| 2018/0269150 | A1 | 9/2018 | Lin et al. | |
| 2019/0198444 | A1 | 6/2019 | Amanapu et al. | |
| 2021/0231990 | A1 | 7/2021 | Shu et al. | |
| 2023/0163071 | A1 * | 5/2023 | Chang | H01L 21/76897 257/758 |

FOREIGN PATENT DOCUMENTS

| | | | |
|---|---|---|---|
| DE | 112022004866 | T5 | 7/2024 |
| EP | 0962101 | A1 | 12/1999 |
| JP | 2001-313371 | A | 11/2001 |
| JP | 2003-092300 | A | 3/2003 |
| JP | 2015-041102 | A | 3/2015 |
| JP | 2024-540432 | A | 10/2024 |
| WO | 2023/093676 | A1 | 6/2023 |

OTHER PUBLICATIONS

Altieri et al., "Plasma-surface interactions at the atomic scale for patterning metals", J. Vac. Sci. Technol., A 35, 05C203, Jul. 20, 2017, pp. 1-13.

Dey et al., "Atomic layer deposited ultrathin metal nitride barrier layers for ruthenium interconnect applications", J. Vac. Sci. Technol. A 35(3), 03E109-1, Apr. 6, 2017, pp. 1-15.

Kanarik et al., "Overview of atomic layer etching in the semiconductor industry", J. Vac. Sci. Technol., A 33, 020802, Mar. 5, 2015, pp. 1-15.

Kanarik et al., "Predicting synergy in atomic layer etching", J. Vac. Sci. Technol. A 35, 05C302, Mar. 27, 2017, pp. 1-8.

Nakahara et al., "Etching technique for ruthenium with a high etch rate and high selectivity using ozone gas", JJ. Vac. Sci. Technol. B 19(6), Microelectronics and Nanometer Structures Processing, Measurement, and Phenomena, Nov. 2001; doi: 10.1116/1.1415517, pp. 1-5.

Hsu et al., "Etching of ruthenium coatings in O2 -and -CI2-containing plasmas", J. Vac. Sci. Technol. A 24, 1, Dec. 9, 2005, pp. 1-9.

International Search Report dated Jan. 19, 2023 issued in PCT/CN2022/133227, 9 pages.

Japan Patent Office, "Notice of Reasons for Refusal" May 12, 2026, 09 Pages, JP Application No. 2024-527348.

German Patent and Trademark Office, "Office Action," Feb. 3, 2026, 13 Pages, DE Application No. 112022004866.2.

* cited by examiner

BEOL TOP VIA WIRINGS WITH DUAL DAMASCENE VIA AND SUPER VIA REDUNDANCY

FIELD OF THE INVENTION

The present invention generally relates to integrated circuits (ICs) that comprise sub-level wirings and/or devices, and methods for fabricating same. More specifically, the present invention relates to ICs that comprise wirings and/or devices that are located in at least one via level between two adjacent line levels.

BACKGROUND OF THE INVENTION

Integrated circuit (IC) designs typically comprise multiple levels of wirings and/or devices that are isolated from one another by an inter-level dielectric (ILD) and are interconnected by multiple metal vias therebetween. The levels at which the wirings and/or devices are located are typically referred to as the "line levels," while the levels at which the metal vias are located are typically referred to as the "via levels."

As IC chips are aggressively scaled, the density of wiring and/or devices at the line levels increases significantly and gradually reaches the maximum density allowed for optimal device performance.

There is a continuing need for further reducing the sizes of the IC chips without adversely affecting the device performance.

SUMMARY OF THE INVENTION

The present invention, in one aspect relates to a system and method for forming semiconductor structures in integrate circuit (IC) devices.

The present invention, in one aspect relates to a system and method for forming semiconductor structures that improves via placement and avoids a double via patterning with memorization.

In one aspect there is provided a semiconductor structure and method that includes the forming of two vias connecting adjacent metal levels to provide a metal via connection redundancy that decreases resistance and consequently improves device performance while decreasing device footprint.

In a further aspect, there is provided a semiconductor structure and method that includes the simultaneous forming of one or more instances of two vias connection, each instance of two via connections connecting adjacent metal levels to provide a metal connection redundancy that decreases resistance and consequently improves device performance.

In a further aspect, there is provided a semiconductor structure and method that includes the simultaneous forming of one or more instances of two vias connection and a "super via" or "skip via" connection that is a via that directly connects two metal levels that are spaced apart and skips an intervening metal level.

In accordance with a first aspect of the present disclosure, there is provided an integrated circuit (IC) device. The IC device comprises: a first interconnect dielectric material layer including a first line level of metal wiring structures; a second interconnect dielectric material layer formed atop the first interconnect dielectric material layer, the second interconnect dielectric material layer including a second line level of metal wiring structures; a third line level of metal wiring structures formed within the second interconnect dielectric material layer; and a via level between the second line level and third line level of metal wiring structures, the via level comprising: a first metal via connecting a second level metal wiring structure to a third level metal wiring structure and a redundant metal via connecting the same second level metal wiring structure to the same third level metal wiring structure.

In accordance with a further aspect of the present disclosure, there is provided a method of forming an integrated circuit (IC) device. The method comprises: forming a first line level of metal wiring structures within a first interconnect dielectric material layer; forming a second interconnect dielectric material layer atop the first interconnect dielectric material layer; forming a second line level of metal wiring structures within the second interconnect dielectric material layer; forming a via level of metal vias connected to one or more second line level metal wiring structures; forming a third line level of metal wiring structures within the second interconnect dielectric material layer, a formed first via level metal via connecting a second line level metal wiring structure to a formed third line level of metal wiring structure; and the forming a third line level of metal wiring structures within the second interconnect dielectric material layer comprising: forming a redundant metal via connecting the same second level metal wiring structure to the same third level metal wiring structure as the first via level metal via.

In accordance with a further aspect of the present disclosure, there is provided an integrated circuit (IC) device. The IC device comprises: a first interconnect dielectric material layer including a first line level of metal wiring structures; a second interconnect dielectric material layer formed atop the first interconnect dielectric material layer, the second interconnect dielectric material layer including a second line level of metal wiring structures; a third line level of metal wiring structures formed within the second interconnect dielectric material layer; and a first metal via comprising a non-etchable damascene metal connecting a second line level metal wiring structure to a third line level metal wiring structure, the first metal via formed by a dual damascene process.

Other aspects, features and advantages of the invention will be more fully apparent from the ensuing disclosure and appended claims.

DETAILED DESCRIPTION

Figure 1A:
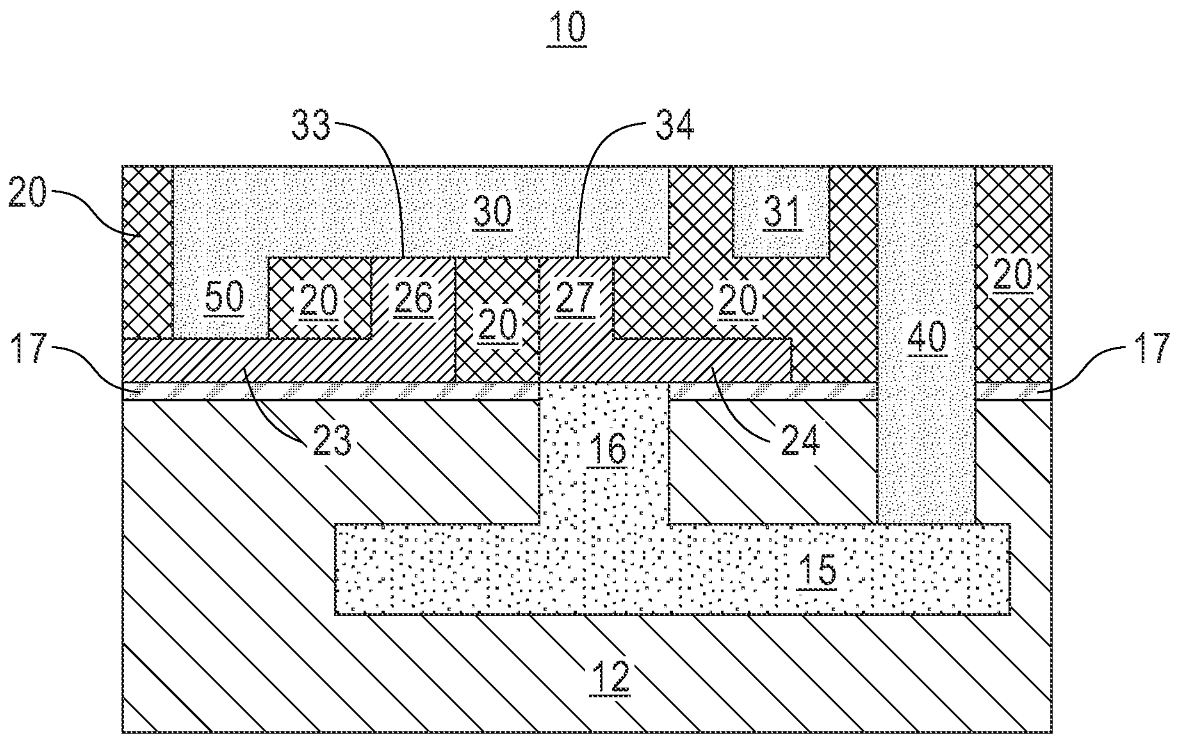
FIG. 1A shows an exemplary cross-sectional view of a portion of a semiconductor device structure illustrating aspects of the present disclosure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

FIG. 1A shows an exemplary cross-sectional view of a portion of a semiconductor device structure 10 illustrating aspects of the present disclosure. As shown in FIG. 1A, the structure 10 highlights Middle-of-Line (MOL) or Back-End-Of-Line (BEOL) semiconductor manufacturing processes for fabricating conductive wiring, contacts, insulating material layers, metal levels, etc. that interconnect already formed individual devices such as logic circuitry components, which include, but are not limited to: capacitors, diodes, resistors, transistors, inductors, varactors, etc. (not shown). As shown in FIG. 1A, the exemplary structure 10, includes, from bottom to top: a first inter-level dielectric (ILD) layer 12 of a low-k dielectric material such as an oxide dielectric material or a silicon doped oxide, a top dielectric material cap layer 17 formed above the inter-level dielectric material layer 12, and a second inter-level dielectric (ILD) material layer 20 of a low-k dielectric material formed above the dielectric material cap layer 17. In an embodiment, preferred ILD layer materials can include SiCOH, SICNH, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using plasma-enhanced chemical vapor deposition (PECVD). Formed within the first inter-level dielectric material layer 12 is an exemplary metal structure 15, e.g., a metal wire, bar or like metal structure. This metal structure 15 is referred to herein as a first metal level ("M1") metal structure. In an embodiment, M1 metal level structure 15 is formed by conventional lithographic patterning, subtractive etching and metal material deposition processes. The metal structure 15 can be formed of an etchable metal material such as Mo, Ru, W, Al, TiN or any other metal material that can be removed by plasma reactive ion etching (RIE). As part of this M1 level structure is a formed metal via 16 that is functional to provide a conductive interconnect to a metal structure, e.g., a second metal level ("M2") formed in the second inter-level dielectric (ILD) material layer 20. This via 16 formed at M1 metal level is referred to as a "M1V1" interconnect and can be formed by conventional subtractive metal etching processes of a same or different etchable metal material including, but not limited to: Mo, Ru, W, Al, TiN. A subsequent planarization process can be performed to expose top surface of the M1V1 via 16 and render it co-planar with a surface of the dielectric cap layer 17. That is, a CMP process of cap layer 17 has a height selectivity over metal from via 16 to achieve having cap layer 17 and top of the via 16 at the same level.

Then, formed by conventional processes, within second inter-level low-k dielectric material layer 20 and deposited atop cap layer 17, are exemplary M2 metal structure 23 and M2 metal structure 24. M2 metal structure 24 is shown formed above and electrically connected to exposed top surface of M1V1 via 16. Further, as shown in FIG. 1A, using subtractive etch processes, there is formed atop the M2 metal structure 23 a "M2V2" top metal via structure 26 and formed atop M2 metal structure 24 a M2V2 top metal via structure 27. The M2 metal structure 24 is located for electric connection to the exposed top surface of the M1V1 interconnect via 16. M2 metal level structures 23, 24 having respective middle M2V2 interconnect via structures 26, 27 are formed of an etchable metal material including, but not limited to: Mo, Ru, W, Al, TiN.

Then, as a result of subsequent semiconductor processing steps including a low-k dielectric refill to form the second inter-level dielectric material layer 20 with embedded M2 metal level structures 23, 24 having respective subtractive metal vias 26, 27, and after result of further CMP processes to planarize the top surface of the second inter-level dielectric material layer 20, there is further formed atop dielectric material layer 20 a top hard mask (not shown) used for defining third metal level ("M3") trenches for subsequent metallization. After performing further lithographic patterning and etching processing steps defining the M3 metal level trenches, there is subsequently performed dual damascene processes to at least form trenches used for forming vias for connecting subsequently formed M3 level metal structures to both M1 and M2 metal level structures. That is, a first dual damascene process is performed to form a "same level" via trench that lands on a portion of the subtractive M2 metal structure 23 and when filled, becomes redundant with prior formed same level metal via 26. This formed "same level" via trench will result in a formed redundant via at a same level as the formed subtractive metal vias 26, 27. This method improves conventional process steps by avoiding a complex double or multi via color patterning to create close proximity for two or more via plus enable multi-level via redundancy. A further dual damascene process is performed to form a "super via" that extends through dielectric material layers 20 and 12 and lands on formed subtractive M1 metal structure 15. Further etching steps can be performed to define additional features that form M3 metal structures. One such further etching step may be performed to remove portions of dielectric material layer 20 to expose top surfaces 33, 34 of respective subtractive metal vias 26 and 27 that connect underlying metal structures 23, 24, respectively. As a result of the further etching steps to define further metallization features by removing further portions of dielectric material layer 20, and after performing a top hard mask removal process for removing the formed top hard mask, damascene metal such as copper (Cu) is deposited to fill the defined same level via and super via trenches and other formed metallization features. Such copper deposition may include forming copper seed layer and then copper deposition steps and fills the same level via and super via trenches and other formed metallization features.

As shown in FIG. 1A, the damascene metal fill and a subsequent chemical-mechanical-planarization (CMP) step results in formed M3 metal structures 30, 31, with M3 metal structure 30 electrically connected with M2 metal structures 23 and 24 via their top surfaces. M3 metal structure 30 further includes a formed same level damascene metal via 50 from the filled same level via trench. The M3 metal structure 30 thus connects with the underlying M2 metal structure 23 via original subtractive metal via 26 and the formed same level damascene metal via 50 referred to as a top "M3V2" interconnect via by dual damascene. The same level damascene metal via 50 and prior formed subtractive metal via 26 are redundant connections between the M3 metal level structure 30 and underlying M2 metal level structure 23. Further, the resulting structure 10 of FIG. 1A depicts the super via trench filled with damascene metal to form super via 40 which provides a direct electrical connection from subsequent formed structures to an underlying M1 metal structure 15.

Figure 1B:
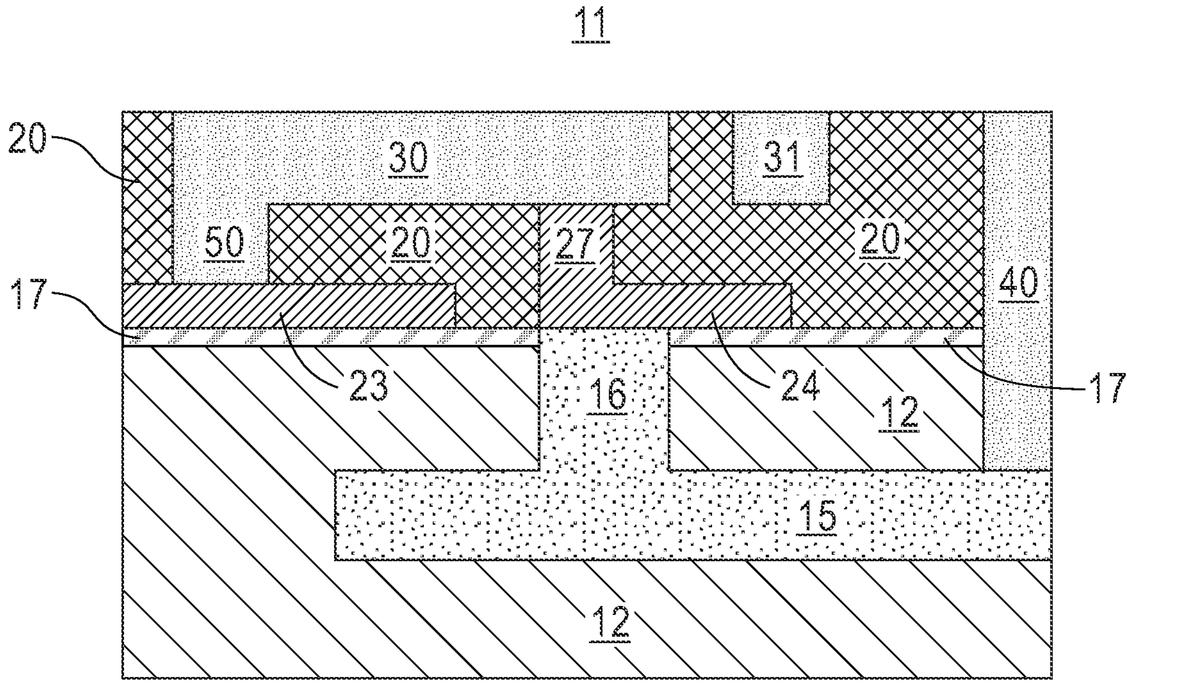
FIG. 1B shows an exemplary cross-sectional view of a portion of a semiconductor device structure illustrating further aspects of an alternate embodiment of the present disclosure.

FIG. 1B shows an exemplary cross-sectional view of a portion of a semiconductor device structure 11 illustrating further aspects of an alternate embodiment of the present disclosure. In particular, FIG. 1B shows exactly the same structure as the resulting structure 10 shown in FIG. 1A, however the structure 11 of FIG. 1B does not include the formed subtractive etch metal via 26 that connects underlying M2 metal level 23. Thus, the only difference between the structure 10 of FIG. 1A and the structure 11 of FIG. 1B is that, in structure 11 of FIG. 1B, the formed top M3V2 damascene metal via connection 50 is the only connection between the M3 metal structure 30 and underlying M2 metal structure 23, i.e., there is no same via level electrical connection redundancy between the M3 metal structure 30 and underlying M2 metal structure 23.

Figure 2A:
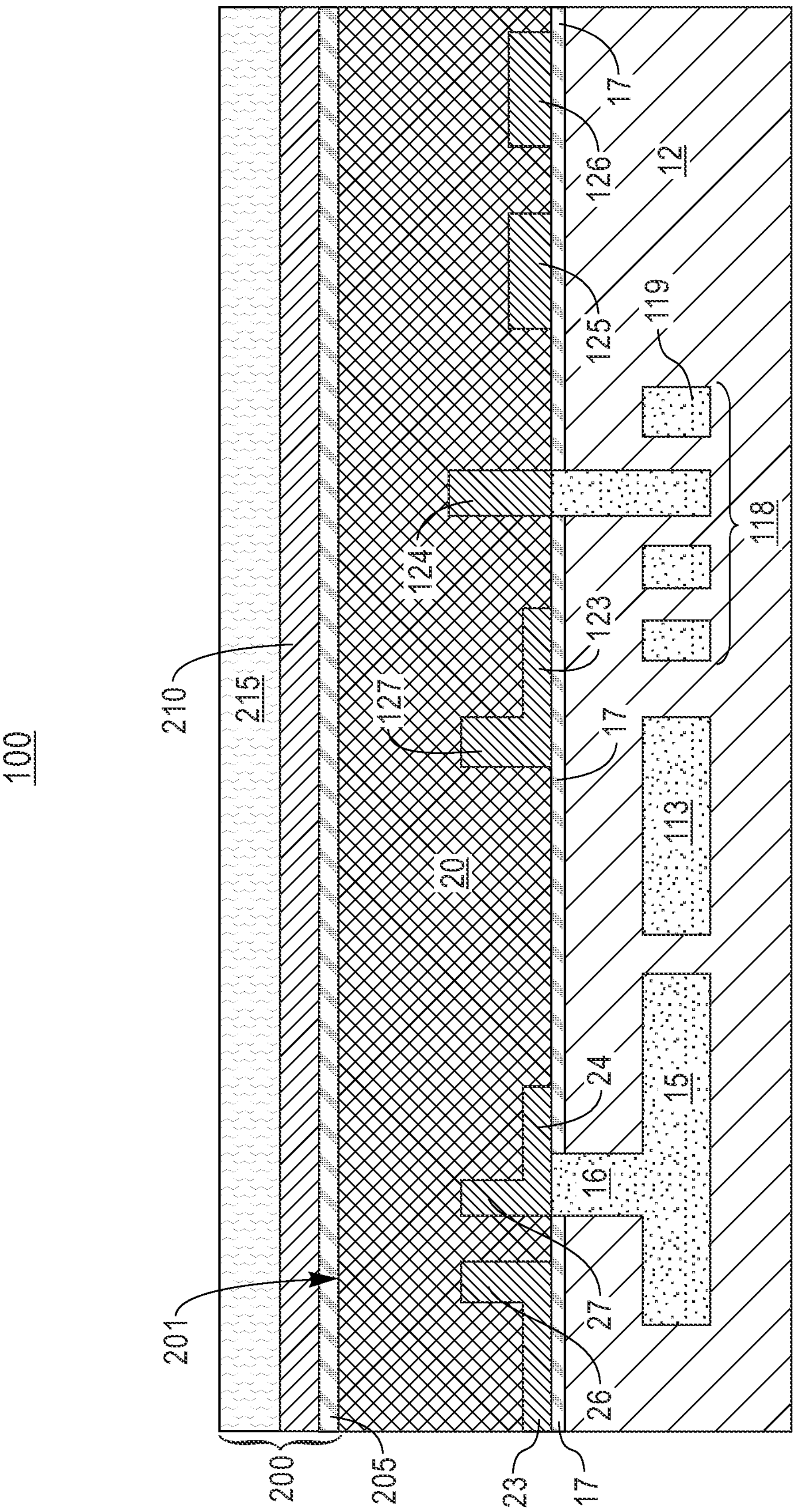
FIGS. 2A-2G illustrate cross-sectional views depicting a sequence of semiconductor manufacturing MOL and BEOL process steps to result in intermediate semiconductor structures used to form devices according to aspects of the present disclosure.
Figure 2B:
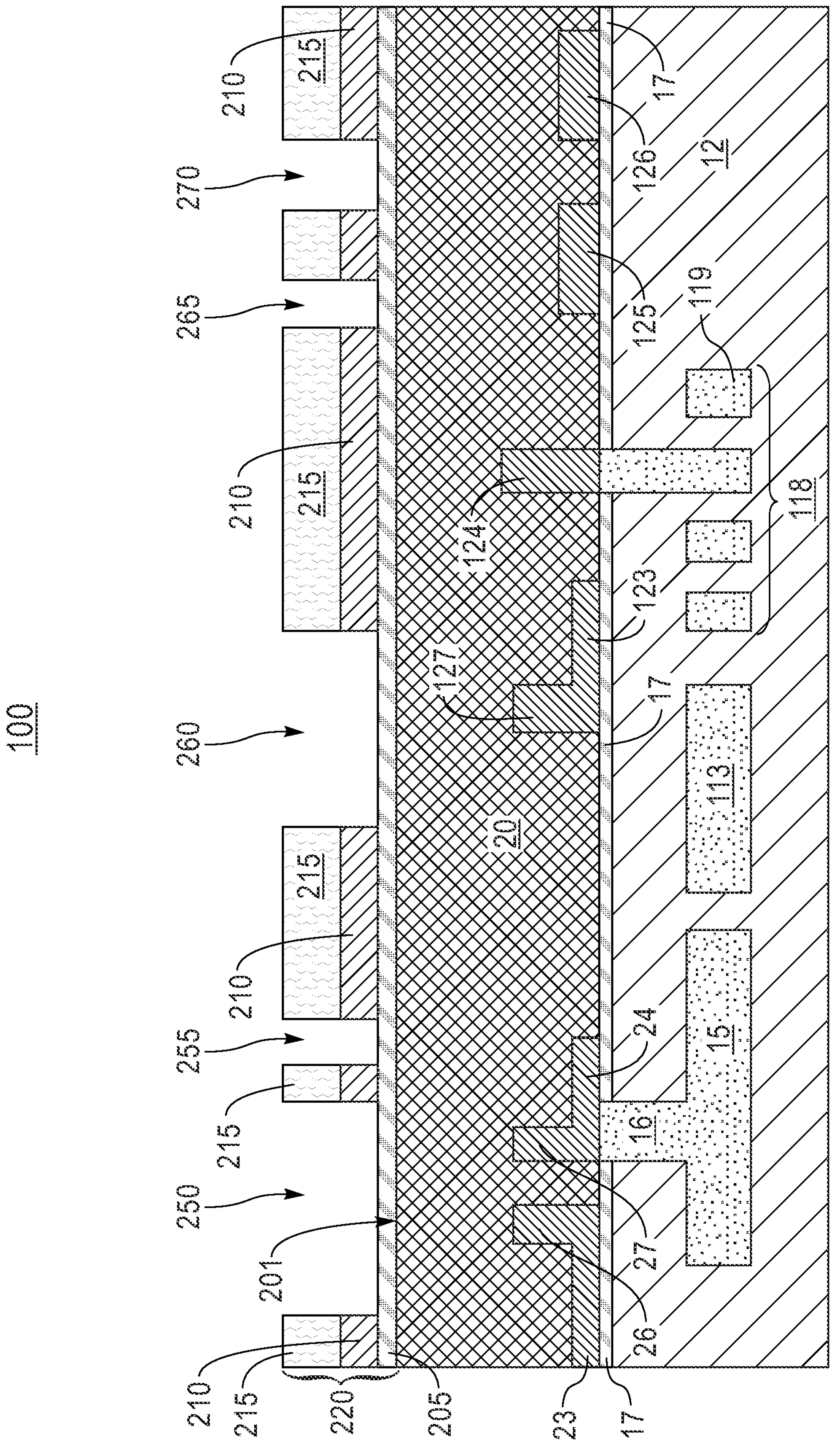
Figure 2C:
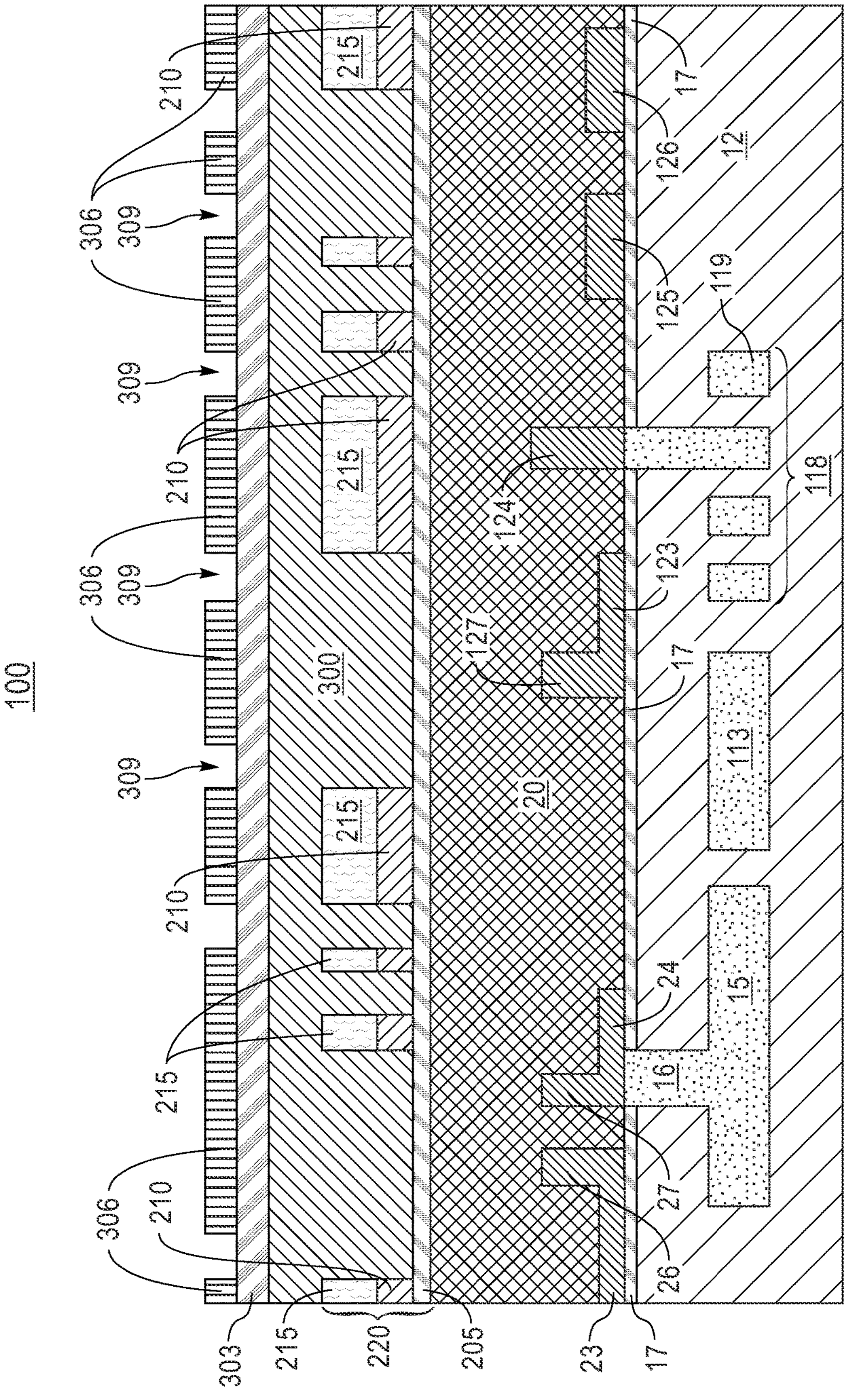
Figure 2D:
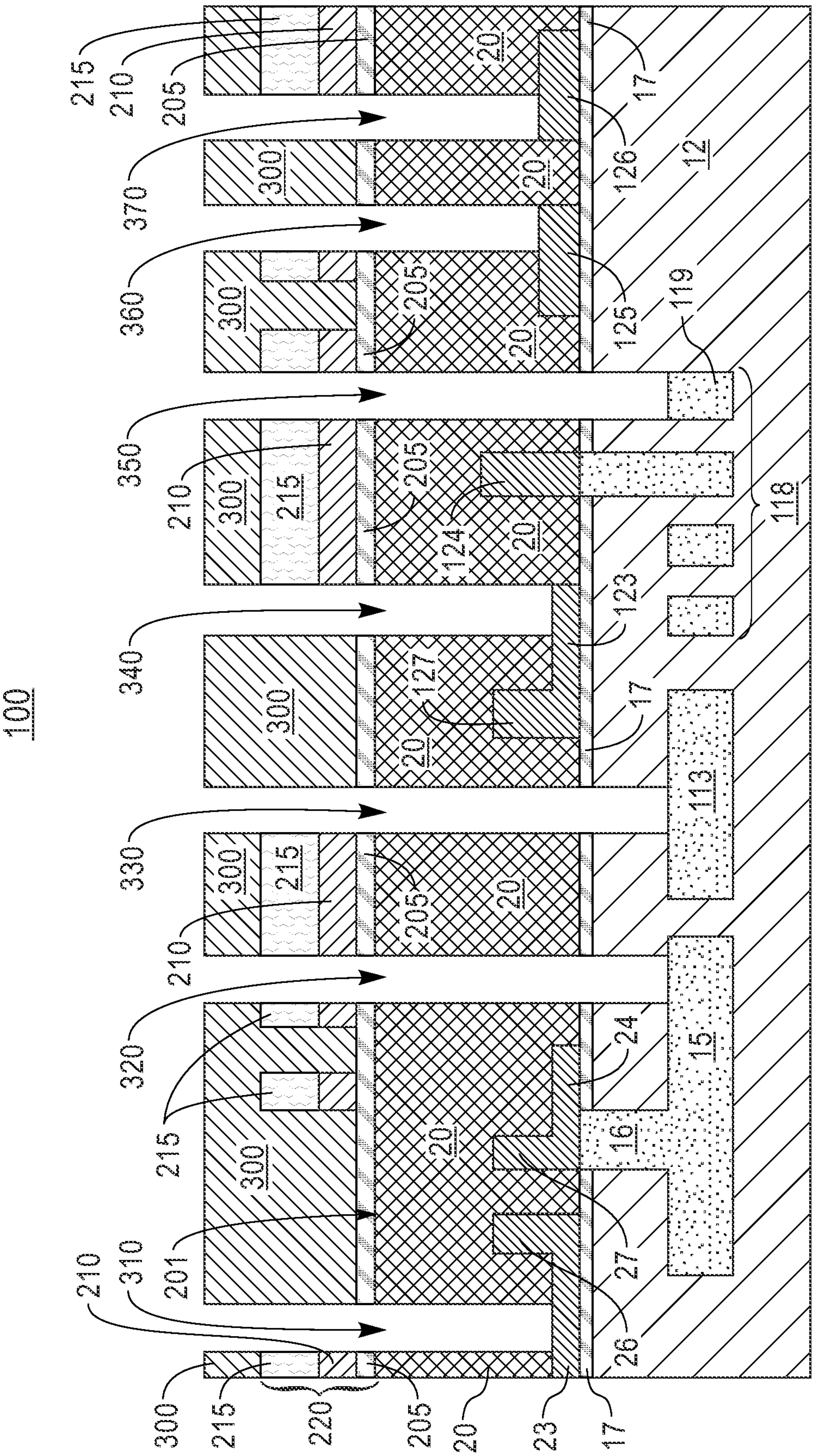
Figure 2E:
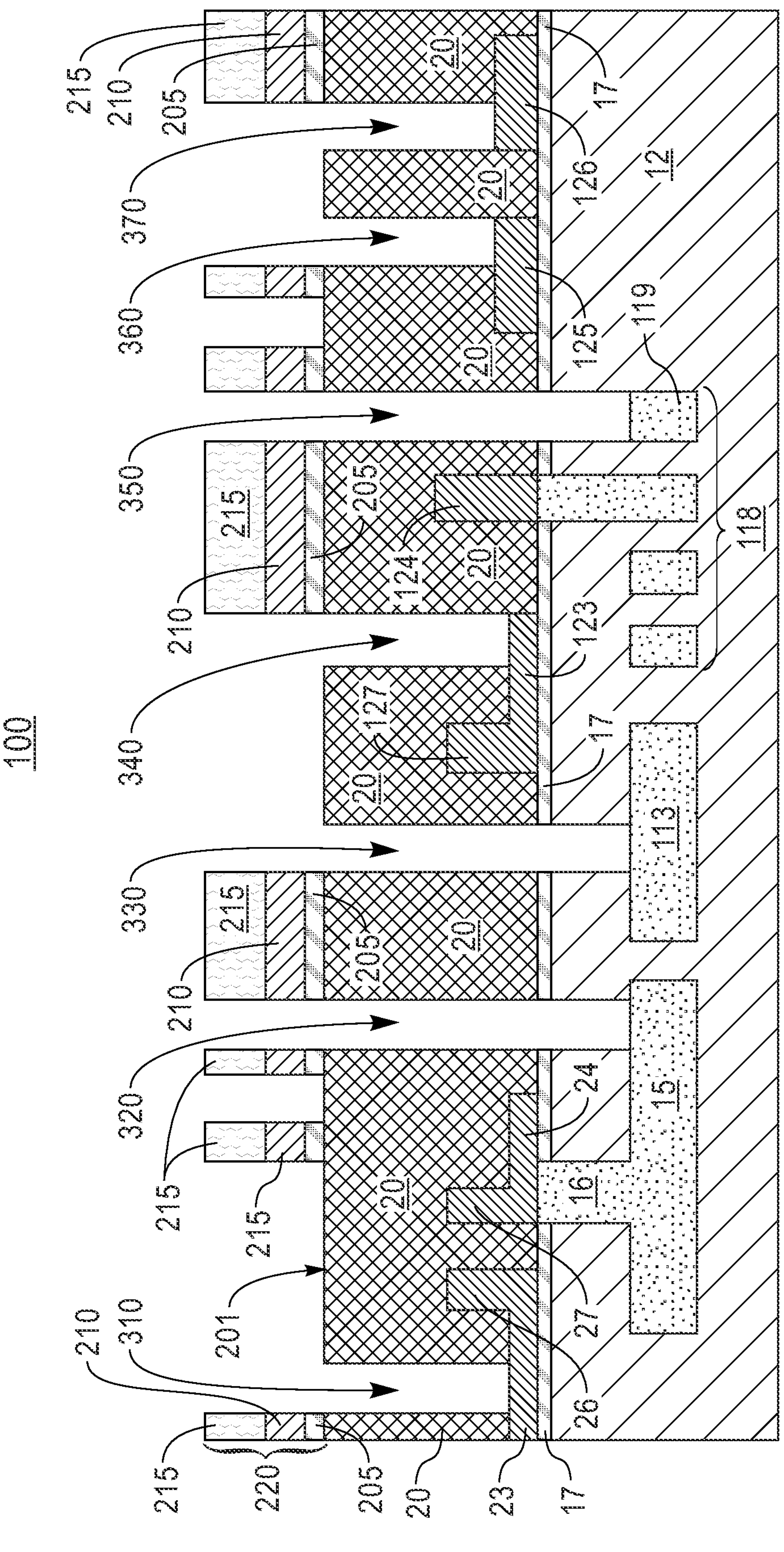
Figure 2F:
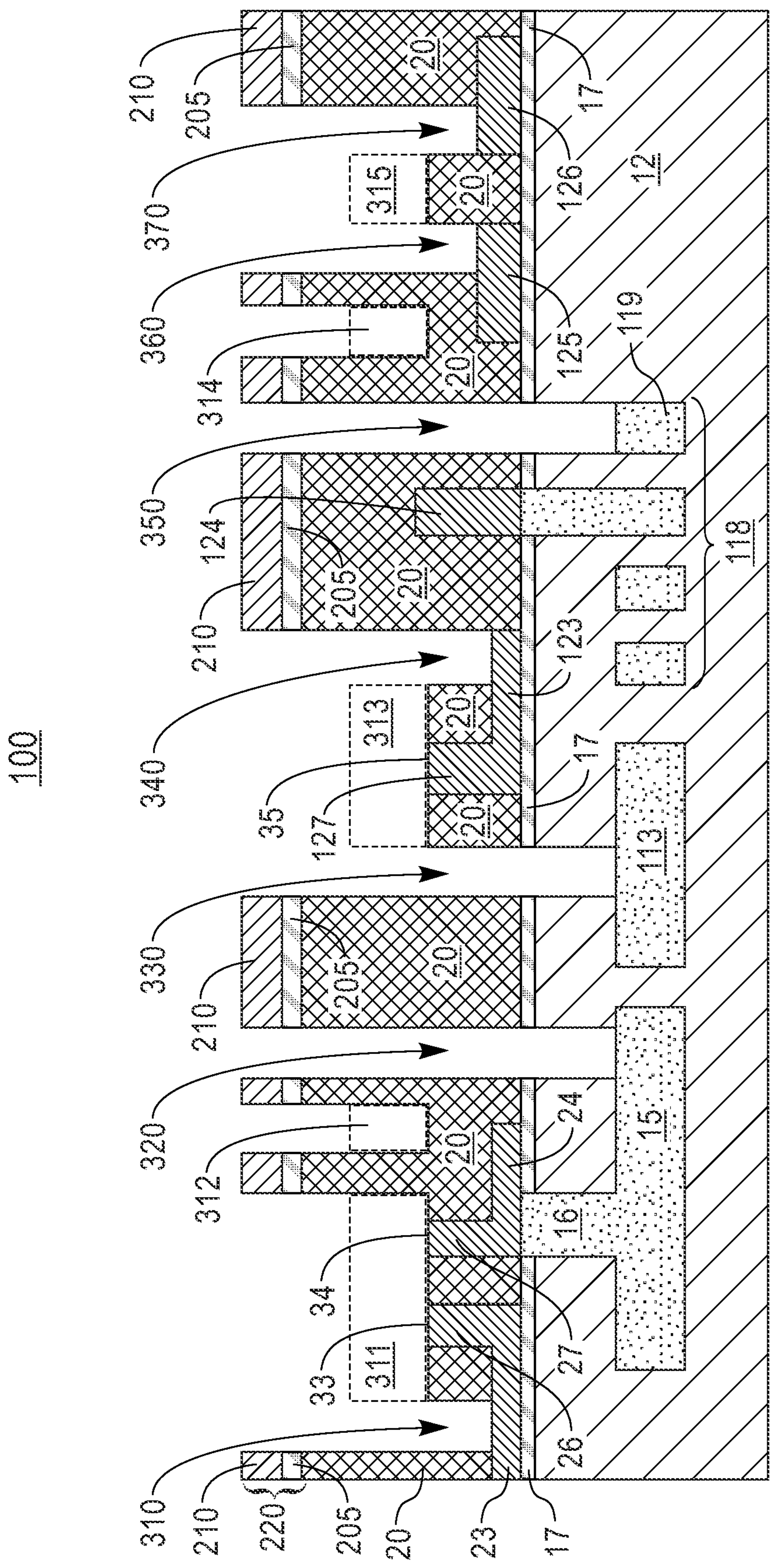
Figure 2G:
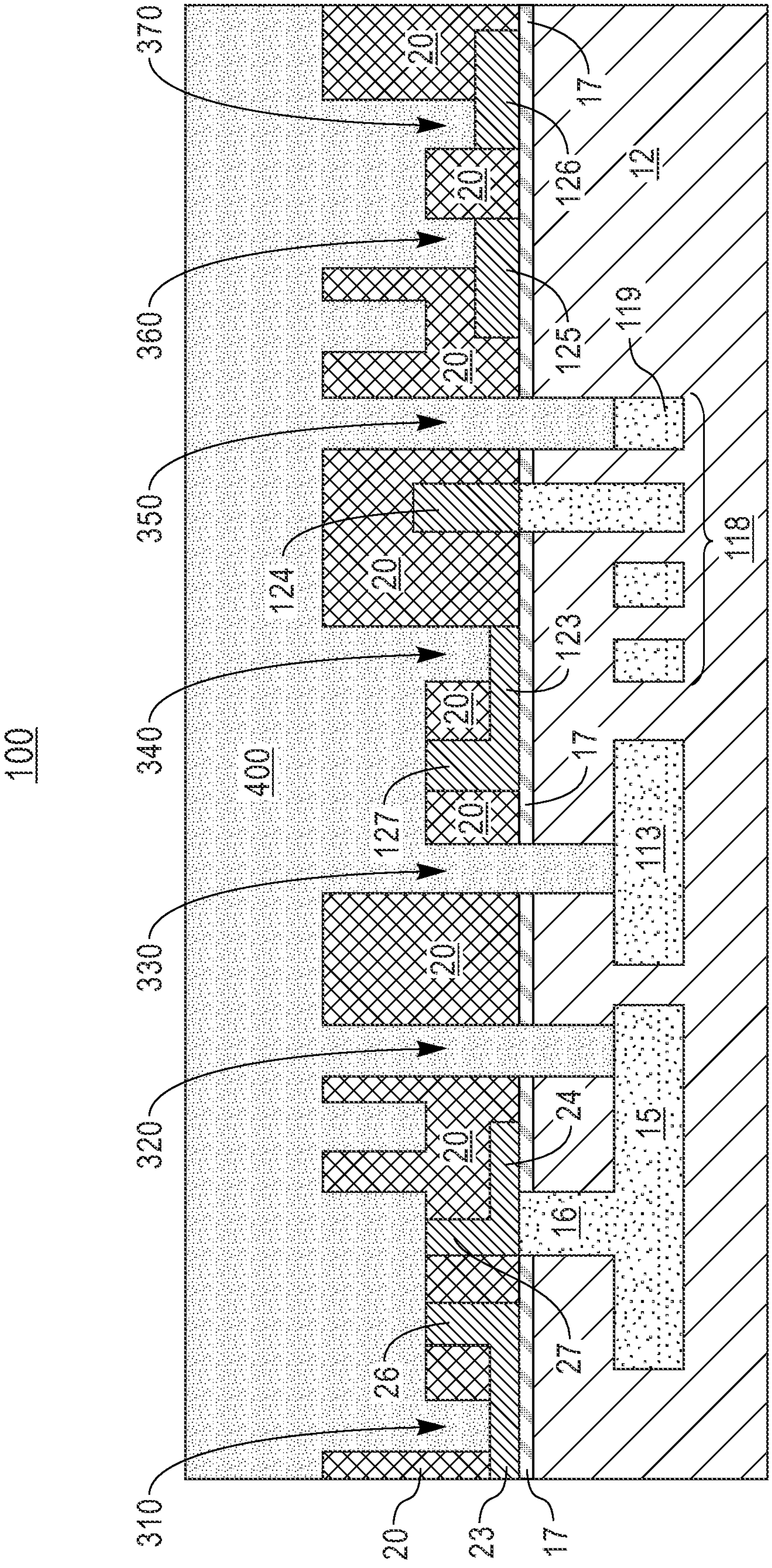
Figure 2H:
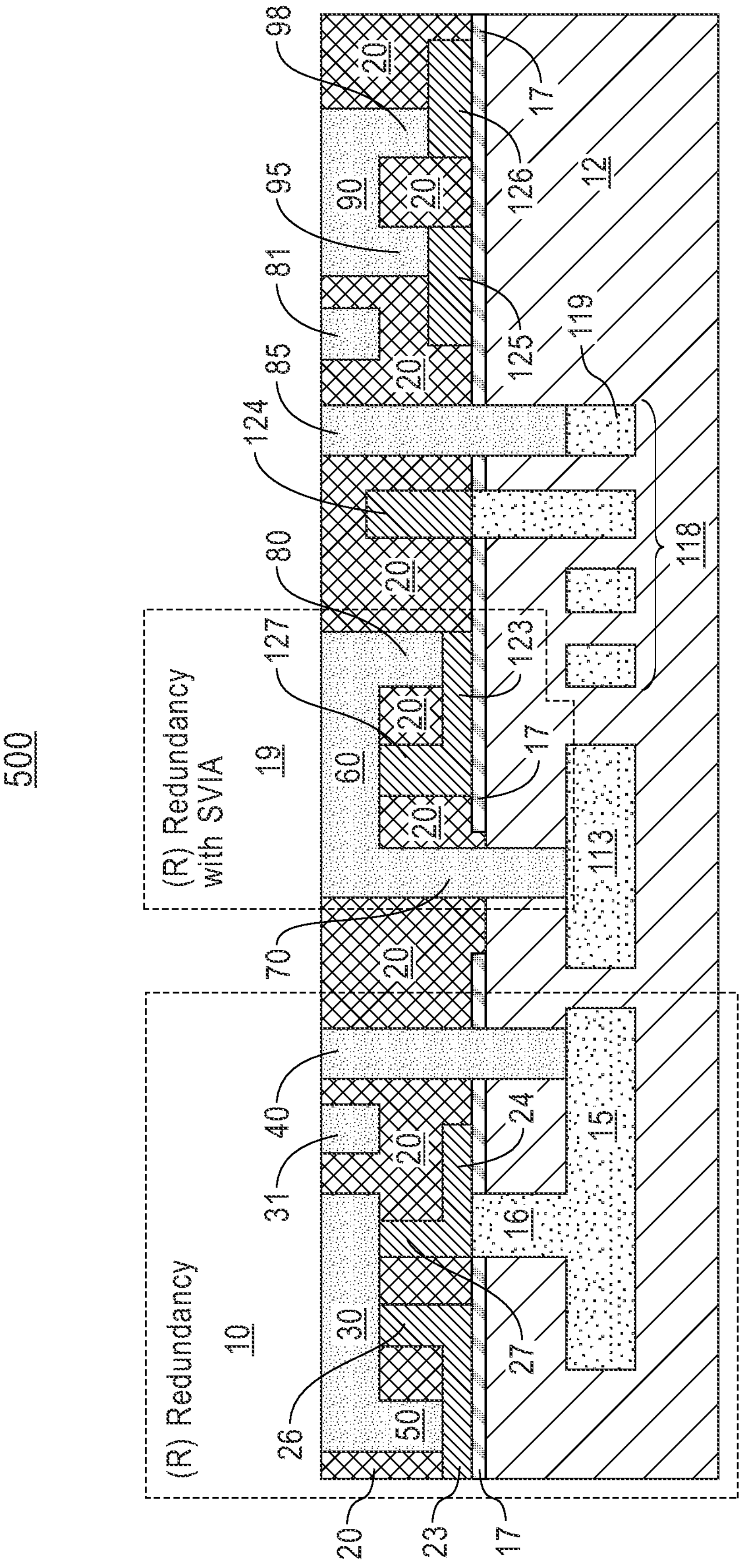
FIG. 2H illustrates a cross-sectional view of a final semiconductor structure that includes a redundant dual damascene metal "same level" vias and dual damascene metal "super vias" according to aspects of the present disclosure.
Figure 2I:
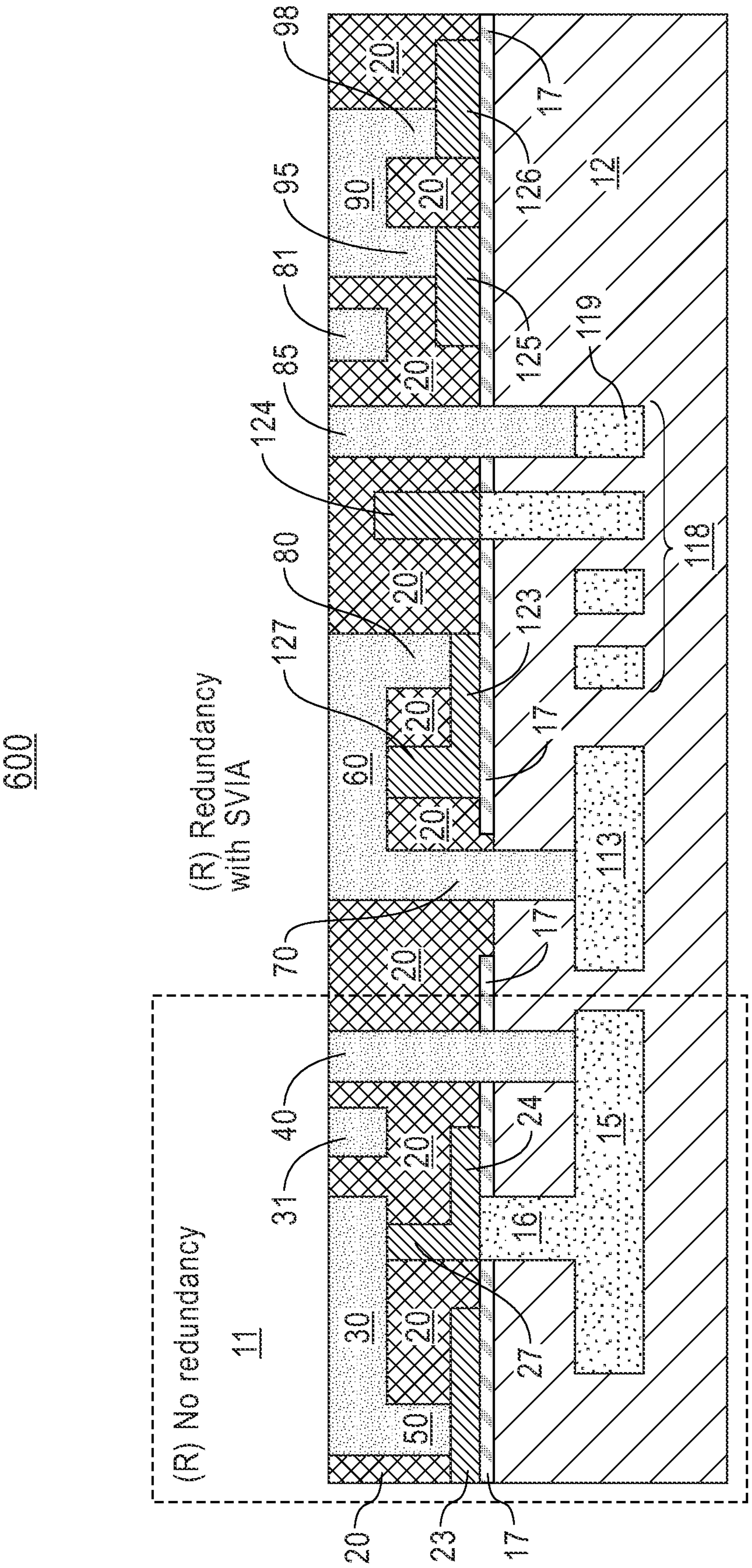
FIG. 2I illustrates a cross-sectional view of an alternate final semiconductor structure that includes a formed dual damascene metal via with no redundancy according to a variation of the present disclosure.

FIGS. 2A-2G illustrate cross-sectional views depicting a sequence of semiconductor manufacturing MOL and BEOL process steps to result in intermediate semiconductor structures that result in final structures shown in FIG. 2H that include redundant dual damascene metal "same level" vias and dual damascene metal "super vias" and shown in FIG. 2I that optionally includes a dual damascene metal via connection that is not redundant.

As shown in FIG. 2A, there is depicted a cross-sectional view of an initial semiconductor structure 100. Initial Structure 100 is formed of MOL or BEOL semiconductor manufacturing processes for fabricating conductive wiring, contacts, insulating material layers, metal levels, etc. that interconnect already formed individual devices such as transistors, capacitors, resistors, etc. (not shown). As shown in FIG. 2A, the exemplary structure 100, includes, from bottom to top: a first inter-level dielectric layer 12 of a low-k dielectric material, an overlying dielectric material cap layer 17 formed above the inter-level dielectric material layer 12 and a second inter-level dielectric material layer 20 of a low-k dielectric material formed above the dielectric material cap layer 17. Formed within the first inter-level dielectric material layer 12 is at least one exemplary first line level (M1) metal structure 15, e.g., a metal wire, bar or like metal wiring structure formed of an etchable metal material such as Mo, Ru, W, Al, TiN or any other metal material that can be removed by plasma RIE (e.g., metal wiring structure). Atop this M1 level wiring structure 15 is a formed M1V1 via 16 formed by conventional subtractive etching processes. The M1V1 via 16 functions to provide a conductive interconnect to a M2 metal structure formed in the second inter-level dielectric material layer 20. A top surface of the M1V1 via 16 is co-planar with a top surface of the dielectric cap layer 17 and is exposed and conductively connected to the formed M2 metal structure. Further, as shown in FIG. 2A, for non-limiting and illustrative purposes, additional first line level (M1) metal level wiring structures can include one or more metal structures 113 and plural spaced-apart metal structures 118 formed in further locations at a same level as M1 metal structure 15. In an embodiment, the first line level metal wirings can have a wire width ranging from about 18 to about 200 nm, and wherein the M1V1 via 16 can have a width ranging from about 18 nm to about 40 nm.

As further shown in FIG. 2A, formed atop dielectric cap layer 17 and within the second inter-level dielectric material layer 20 is at least an exemplary second line level (M2) metal structure 23 and M2 metal structure 24 as in FIG. 1A. The M2 metal structure 24 is formed for electric connection to the exposed top surface of the M1V1 interconnect via 16. M2 metal level wiring structures 23, 24 having respective vias 26, 27 are formed of an etchable metal material such as Mo, Ru, W, Al, TiN. Further formed by subtractive etch processes above M2 metal structure 23 is a top via portion 26 and formed by subtractive etch processes above M2 metal structure 24 is a top via portion 27 as in FIG. 1A. Further shown in FIG. 2A, for non-limiting and illustrative purposes, are one or more further exemplary M2 metal level structures 123, 124, 125 and 126 formed by conventional lithographic patterning, subtractive etching and metal material deposition processes. These additional exemplary M2 metal level structures 123, 124, 125 and 126 are formed at further locations atop dielectric cap layer 17 within second inter-level dielectric material layer 20. After forming the exemplary M2 metal level structures 123, 124, 125 and 126, a subsequent low-k dielectric material re-fill process is performed and a subsequent CMP process is performed to planarize a surface 201 of the second inter-level dielectric material layer 20. In an embodiment, the second line level metal wirings can have a wire width ranging from about 18 to about 200 nm and wherein the formed subtractive etch vias 26, 27, 124, 127 can have a width ranging from about 18 nm to about 40 nm.

In embodiments, the first inter-level dielectric material layer 12 and second inter-level dielectric material layer 20 can be a low-k dielectric material layer (e.g., having a dielectric constant less than that of $SiO_2$). These inter-level dielectric material layers can be a hybrid dielectric structure that comprises at least two different dielectric materials. For example, layers 12 and 20 could be composed of two or more different dielectric layers in order to optimize the device R/C performance. For example, ILD layer 12 or 20 can be a two layer film: the bottom film optimized for the via performance with a height equivalent of the via and the top film optimized for the trench performance.

Formed atop surface 201 of the second inter-level dielectric material layer 20 is a dielectric material layer or a stack 200 of dielectric material layers, including, for example, from bottom to top: a further dielectric cap layer 205 of a thickness ranging between 5 nm to 20 nm, a hard mask layer 210, e.g., of a material such as TiN W, WC, WSi, BN of a thickness ranging between 10 nm to 40 nm, for example, and a further top Tetraethyl orthosilicate (TEOS) dielectric material layer 215 of a thickness ranging between 10 nm to 40 nm. These layers 205, 210, 215 form a hard mask open (HMO) etch stack used for defining further trenches for forming M3 metal level structures and can be formed by conventional deposition technique including, for example, chemical vapor deposition (CVD), plasma enhanced chemical vapor deposition (PECVD), physical vapor deposition (PVD).

FIG. 2B further depicts a structure resulting from further applied steps to pattern the hardmask layer stack 200 to define features of M3 metal structure to be subsequently formed. These next level metallization features are formed by further lithographic patterning and RIE etching steps for etching a pattern of trenches 220 in the HMO layered stack 200, the etching for forming each trench stopping on the surface 205 of dielectric cap layer 205 above the second interlevel dielectric layer 20. For non-limiting, and illustrative purposes, as shown in the exemplary structure 100 of FIG. 2B, applied lithographic patterning and RIE etching has formed exemplary trenches 250, 255, 260, 265 and 270 in the hardmask layer forming HMO trench pattern 220. In an embodiment, the lithographic patterning step can include forming a photoresist (not shown) atop a surface of the hard mask layered stack 200, exposing the photoresist to a desired pattern of radiation and then developing the exposed photoresist utilizing a conventional resist developer. The pattern within the photoresist is then transferred through the hard mask 200 and stopping on layer 205 with a minimal recess (e.g., <5 nm). A single etch or multiple etching can be used to provide the resulting HMO trench pattern 220 illustrated in FIG. 2B. The etch or multiple etches can include a dry etch process, a chemical wet etch process, or any combination thereof. When a dry etch is used, the dry etch can be a reactive ion etch process, a plasma etch process, ion beam etching or laser ablation. The patterned photoresist material can be removed any time after transferring the pattern into at least the hard mask utilizing a conventional stripping process.

FIG. 2C further depicts a structure resulting from forming a lithographic stack composed of an organic planarization material (OPL) layer 300 that fills each formed trench 255, 260, 265 and 270 of the formed pattern of trenches 220 in patterned HMO layer 200 and whose coverage extends to a thickness above the height of the remaining HMO layer stack portions of the patterned HMO stack layer 220 to encapsulate the remaining HMO layer stack portions of the patterned HMO stack layer 220. In an embodiment, the OPL layer 300 can be formed by OPL. Further formed above OPL layer 300 is a thin oxide layer 303 deposited by ALD or LTO or a spin layer such as Silicon-containing antireflection coating (SiARC), with a further top resist layer 306 developed by lithographic process to form locations 309 for the via pattern. In an embodiment, the via pattern including via locations 309 are formed by exposing the photoresist layer 306 atop a surface of the oxide layer 303 to a desired pattern of radiation and then developing the exposed photoresist utilizing a conventional resist developer. The pattern within the photoresist is then transferred through the sacrificial OPL layer 300 and the underlying ILD layer 20 and the underlying ILD layer 12.

Referring to FIG. 2D, there is depicted a further exemplary structure 100 resulting from further applied dual damascene lithographic patterning and etching steps for etching trenches at one or more locations 309 of the formed via pattern through the sacrificial OPL layer 300 and second interlevel dielectric material layer 20 that will be used to form redundant same level via connections between various M3 metal level structures to be formed and underlying M2 metal level structures. FIG. 2D further depicts the structure resulting from further applied dual damascene for etching, at other location(s) 309 of the formed via pattern, further vias that extend through sacrificial, OPL 300, second interlevel dielectric material layer 20 and portions of first interlevel dielectric material layer 12 that will be used to form super via connections between various M3 metal level structures to be formed and underlying M1 metal level structures. For example, lithographic patterning and RIE etching steps are performed in a dual damascene process to create via through the sacrificial OPL 300 and second interlevel dielectric material layer 15 including: same metal level via trenches 310, 340 used to form respective redundant same level via connections to the M2 metal structures 23, 123, respectively, and dual damascene processes to create trenches through the sacrificial, OPL layer 300, second interlevel dielectric material layer 15 and portions of the first interlevel dielectric material layer 12 including: super via trench 320 used to form a super via connection from a M3 metal level structure feature to be formed and the M1 metal structure 15, a super via trench 330 used to form a super via connection from a M3 metal level structure feature to be formed and the M1 metal structure 113, and a super via trench 350 used to form a super via connection from another M3 metal level structure to the M1 metal structure 119. FIG. 2D shows results of further dual damascene lithographic patterning and RIE etching processes to create additional via trenches 360, 370 used to form a via connections from respective other M3 metal level structure features to be formed and respective M2 metal level structures 125, 126.

In an embodiment, a single etch or multiple etching can be used to provide the resulting M3V2 level trenches 310, 340 that stop on surfaces of underlying M2 level metal wiring structures as illustrated in FIG. 2D and the super via or skip via trenches 320, 330, 350 that stop on surfaces of underlying M1 level metal wiring structures. The etch or multiple etches can include a dry etch process, a chemical wet etch process, or any combination thereof. When a dry etch is used, the dry etch can be a reactive ion etch process, a plasma etch process, ion beam etching or laser ablation. The patterned photoresist material is removed during the opening of OPL layer 300 with for example an etch plasma composed of O2, CO/CO2 or N2/H2 for example. Layer 303 (e.g., SiARC) is removed during the dielectric etch of layer 205, 20, 17 and 12 with for example an etch plasma composed of carbon fluorate gases such as CF4, C4F8, C4F6, plus Additional gases such as CH2H2, Ar, N2 and O2.

FIG. 2E shows a result of a further blanket etching step for etching through and removing the remaining sacrificial OPL layer 300 selective to the underlying interlevel dielectric material layer material surface 201 and hard mask from stack 220. OPL layer 300 can be removed for example by an etch plasma composed of N2/H2, CO/CO2, O2 to achieve high selectivity over the dielectric and metallic layers. After removing sacrificial OPL layer 300 there remains portions of the patterned HMO layered stack 220 atop the surface 201 of the second inter-level dielectric level 20.

FIG. 2F shows a result of a further etching steps for etching the structure of FIG. 2E including an RIE etching through the interlevel dielectric material layer material surface 201 to remove further portions of second interconnect dielectric material layer 20 to further define a topography for subsequent forming M3 level metallization features and corresponding M3 metal structures, the forming of the redundant same level vias between formed M3 metal level structures and underlying M2 metal level structures, and the forming of the super vias between formed M3 metal level structures and underlying M1 metal level structures. As shown in FIG. 2F, the particular portions 311, 312, 313, 314 and 315 of second interconnect dielectric material layer 20 are etched and removed. The etching may be a timed etch, or an etch of portions 311, 312, 313, 314 and 315 that is selective to and stops on a top surface of formed subtractive metal vias 26, 27, 127 formed connecting respective underlying M2 metal level structures 23, 24, 123. A result of removing further second inter-level dielectric material portion 311 is to expose top surfaces 33, 34 of underlying formed subtractive metal vias 26, 27. Likewise, a result of removing further inter-level portion 313 is to expose top surface 35 of underlying formed subtractive metal via 127. FIG. 2F shows further results after performing a step for removing the TEOS layer 215 from the patterned HMO stack 220 and leaving remaining portions of underlying TiN hardmask layer 210.

FIG. 2G shows a result of a further process steps to remove the remaining layers 205, 210 of patterned HMO stacked hardmask layer 220 and to deposit a damascene metal 400 within formed trenches and atop the surfaces of remaining portions of second interconnection level dielectric material layer 20 including exposed top surfaces of subtractive metal vias 26, 27, 127 in the structure shown in FIG. 2F. A metal seed and or liner may be deposited before the main metallization if needed, for example, if the metal is Copper. As shown in FIG. 2G, the damascene metal 400 is deposited to fill the same metal level via trenches 310, 340 used to form respective redundant same level via connections to the M2 metal structures 23, 123, respectively and is deposited to: fill super via trench 320 with damascene metal to form a super via connection from a M3 metal level structure to be formed and the M1 metal structure 15; fill super via trench 330 with damascene metal to form a super via connection from a M3 metal level structure to be formed and the M1 metal structure 113; and fill super via trench 350 with damascene metal to form a super via connection from another M3 metal level structure to be formed and the M1 metal structure 119. Further, the deposited damascene metal fills trenches 360 and 370 in order to form metal via connections between the other M3 metal level structures to be formed and the respective M2 metal structures 125, 126. In an embodiment where the damascene metal is Copper, one way of copper deposition is electroplating which is a two-step process that can include first depositing a seed layer on the wafer using PVD and then Cu electroplating.

FIG. 2H shows results of a further CMP processing step to planarize and remove top portion of damascene metal level 400 to form the final M3 metal level structures resulting in a final semiconductor device structure 500 that includes the structure 10 shown in FIG. 1A. That is, as a result of CMP processing, there is formed M3 level metallization features shown in the structure 10 of the embodiment of FIG. 1A including M3 metal structure 30 having a portion including same level top M3V2 interconnect metal via 50 connecting M3 metal structure 30 to underlying M2 metal structure 23 that is redundant with subtractive metal via 26 and a portion that further connects to M2 metal structure 24 through subtractive metal via 27 as in the embodiment of the final structure 10 depicted in FIG. 1A. Further, the CMP process results in formed metallization features including M3 metal structure 31 and stand-alone M3 super via 40 for connecting subsequent structures to underlying M1 metal level structure 23 as in an embodiment of the final structure 10 depicted in FIG. 1A.

In an embodiment, as a result of the same CMP processing, there is formed further final M3 level metallization features including: an M3 metallization structure 19 including an M3 metal wiring structure 60 including at one end a formed super via 70 portion connecting M3 metal level structure 60 to underlying M1 metal level structure 113 and at another end a redundant same level metal via 80 portion connecting M3 metal wiring structure 60 to underlying metal structure 123 that is redundant with subtractive metal via 127 that also connects the M3 metal wiring structure 60 to underlying metal structure 123; another stand-alone M3 level super via 85 for connecting subsequent structures to underlying M1 metal level structure 119; a further M3 metal structure 81; and a further M3 metal structure 90 including metal via connection 95 for connecting M3 metal structure 90 to underlying M2 metal structure 125 and at an opposing end, another metal via connection 98 for connecting M3 metal structure 90 to another underlying M2 metal structure 126.

FIG. 2I shows an exemplary cross-sectional view of an exemplary semiconductor device structure 600 of an alternative embodiment that is exactly the same structure as the resulting structure 500 shown in FIG. 2H, however includes the structure 11 of FIG. 1B. That is, the only difference between the structure 500 of FIG. 2H and the structure 600 of FIG. 2I is that the structure 600 of FIG. 2I includes the formed structure 11 of FIG. 1B where the formed damascene M3V2 metal via connection 50 is the only via connection formed between the M3 metal structure 30 and the underlying M2 metal structure 23, i.e., there is no same level via connection redundancy between the M3 metal structure 30 and underlying M2 metal structure 23 as it does not include subtractive etch metal via 26. In FIGS. 2H and 2I, all top surfaces of M3 metal structures 30, 31, 40, 60, 85, 81, 90 are coplanar with top surfaces of the second interconnect dielectric material layer 20.

FIGS. 2A-2I thus highlight method steps for forming an IC chip according to embodiments of the present invention. These highlighted steps result in semiconductor device structures that include redundant same via level formation using a top via subtractive etch and bottom via from dual damascene etch techniques. In embodiments, as shown in FIG. 1B, the same level redundancy via option is optional. The provision of redundant same via level connections using dual damascene processes improves resistance and capacitive performance. Further highlighted method steps result in semiconductor device structures that include a direct super via connection bypassing subtractive metal level via formations. These highlighted method steps increase design flexibility—by improving the via placement and avoiding a double via patterning with memorization. These application of the method steps further reduce device footprint with a shorter and more direct interconnect routine with the added benefit of reduced via connection height and shorter metal connections. Such method steps and resulting IC device structures utilizes the underutilized space in IC chips, and allows further size reduction of the IC chips without adversely impacting the device performance.

While FIGS. 1A-1B and 2A-2I illustratively demonstrates exemplary structures and processing steps, according to specific embodiments of the present invention, it is clear that a person ordinarily skilled in the art can readily modify such structures or process steps for adaptation to specific application requirements, consistent with the above descriptions.

It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. An integrated circuit (IC) device comprising:

a first inter-level dielectric material layer including a first line level of metal wiring structures;

a dielectric material cap layer formed above the first inter-level dielectric material layer;

a single second inter-level dielectric material layer formed atop the dielectric material cap layer, the single second inter-level dielectric material layer including a second line level of metal wiring structures formed on top the dielectric material cap layer and including a third line level of metal wiring structures formed within the single second inter-level dielectric material layer above the second line level of metal wiring structures with no dielectric cap layer between the second line level of metal wiring structures and the third line level of metal wiring structures;

a via level between the second line level and third line level of metal wiring structures, the via level comprising:

a first metal via connecting a second level metal wiring structure to a third level metal wiring structure within the single second inter-level dielectric material layer and a second redundant metal via connecting the same second level metal wiring structure to the same third level metal wiring structure within the single second inter-level dielectric material layer, wherein the first metal via connecting the second level metal wiring structure to a third level metal wiring structure comprises a subtractive etch metal and the redundant metal via connecting the same second level metal wiring structure to the same third level metal wiring structure comprises a non-etchable damascene metal; and a further via level between the first line level of metal wiring structures and third level metal wiring structures, said further via level comprising:

a super via connection of metal material directly connecting a first level metal wiring structure of the first line level of metal wiring structures to the third level metal wiring structure of the third line level of metal wiring structures without contacting a second level metal wiring structure of the second line level within the single second inter-level dielectric material layer, the super connection of metal material comprising a non-etchable damascene metal; and wherein the second level metal wiring structure is of a same subtractive etch metal material as the first metal via, the second level metal wiring structure and the first metal via forming a first continuous unitary structure, and the third level metal wiring structure is of a same non-etchable damascene metal as the redundant metal via, the third level metal wiring structure and the redundant metal via forming a second continuous unitary structure.

2. The integrated circuit as claimed in claim 1, wherein a first metal via connecting the second level metal wiring structure to a third level metal wiring structure is a sole non-redundant via connection comprising a non-etchable damascene metal.

3. The integrated circuit as claimed in claim 1, further comprising:

a further via level between the first level and second level metal wiring structures, said further via level comprising:

one or more metal via connections connecting one or more first level metal wiring structures of the first line level to one or more second level metal wiring structures of the second line level, a metal via connecting a first level metal wiring structure to the second level metal wiring structure comprises a non-etchable damascene metal.

4. The integrated circuit as claimed in claim 3, wherein a formed third level metal wiring structure further comprises:

a redundant metal via portion connecting the third level metal wiring structure to a second level metal wiring structure that is redundant with a further metal via connecting the same second level metal wiring structure to the formed third level metal wiring structure; and a super via portion connecting the third level metal wiring structure to the first level metal wiring structure.

5. The integrated circuit as claimed in claim 4, wherein the formed third level metal wiring structure including redundant metal via portion and super via portion is formed of a non-etchable damascene metal material and said further metal via comprises a subtractive etch metal.

* * * * *